(12) United States Patent
Wong et al.

(10) Patent No.: US 7,782,935 B1
(45) Date of Patent: Aug. 24, 2010

(54) HALF-RATE DFE WITH DUPLICATE PATH FOR HIGH DATA-RATE OPERATION

(75) Inventors: Wilson Wong, San Francisco, CA (US); Sergey Yuryevich Shumarayev, San Leandro, CA (US); Simardeep Maangat, Sunnyvale, CA (US); Thungoc M. Tran, San Jose, CA (US); Tim Tri Hoang, San Jose, CA (US); Tin H. Lai, San Jose, CA (US)

(73) Assignee: Altera Corporation, San Jose, CA (US)

( * ) Notice: Subject to any disclaimer, the term of this patent is extended or adjusted under 35 U.S.C. 154(b) by 959 days.

(21) Appl. No.: 11/514,490

(22) Filed: Aug. 31, 2006

(51) Int. Cl.
*H03H 7/30* (2006.01)
(52) U.S. Cl. .................. 375/233; 375/229; 375/232; 708/300
(58) Field of Classification Search .............. 375/233, 375/229, 232; 3/233; 708/300
See application file for complete search history.

(56) References Cited

U.S. PATENT DOCUMENTS

| 7,254,343 | B2 * | 8/2007 | Gu et al. | 398/164 |
| 7,443,913 | B2 * | 10/2008 | Bhakta et al. | 375/233 |
| 2006/0088089 | A1 * | 4/2006 | Gondi et al. | 375/232 |
| 2006/0188043 | A1 * | 8/2006 | Zerbe et al. | 375/346 |
| 2006/0233231 | A1 * | 10/2006 | Yen et al. | 375/233 |
| 2006/0239341 | A1 * | 10/2006 | Marlett et al. | 375/233 |
| 2006/0291552 | A1 * | 12/2006 | Yeung et al. | 375/233 |
| 2008/0008233 | A1 * | 1/2008 | Cohen | 375/232 |

OTHER PUBLICATIONS

Jing Chen et al "A 6.25 Gb/s Pipelined Half-Rate Decision Feedback Equalizer for High Speed Backplane Data Communications" IEEE Jun. 2005.*
Lee et al., "Analysis and Modeling of Bang-Bang Clock and Data Recovery Circuits," IEEE Journal of Solid-State Circuits, vol. 39, No. 9, Sep. 2004, pp. 1571-1580.
Walker, Richard C., "Designing Bang-Bang PLLs for Clock and Data Recovery in Serial Data Transmission Systems," a chapter appearing in "Phase-Locking in High-Performance Sytems—From Devices to Architectures", edited by Behzad Razavi, IEEE Press, 2003, ISBN 0-471-44727-7.

* cited by examiner

*Primary Examiner*—David C Payne
*Assistant Examiner*—Leon Flores
(74) *Attorney, Agent, or Firm*—Ropes & Gray LLP; Robert R. Jackson

(57) ABSTRACT

Methods and circuits are presented for providing equalization, including decision feedback equalization (DFE), to high data-rate signals. Half-rate delay-chain circuitry produces delayed samples of an input signal using two or more delay-chain circuits operating at a fraction of the input signal data-rate. Two delay-chain circuits operating at one-half the input signal data-rate may be used. More generally, n delay-chain circuits operating at 1/n the input signal data-rate may be used. Multiplexer circuitry combines the outputs of the delay-chain circuits to produce an output signal including samples of the input signal at the input signal data-rate. Duplicate path DFE circuitry includes two paths used to provide DFE equalization while reducing the load of the DFE circuitry on the circuitry that precedes it. A first path produces delayed samples of a DFE signal, while a second path produces the DFE output signal from the delayed samples.

21 Claims, 8 Drawing Sheets

HALF-RATE DFE WITH DUPLICATE PATH FOR HIGH DATA-RATE OPERATION

BACKGROUND OF THE INVENTION

This invention relates to equalization methods and circuits for data communication. Methods and circuits are presented to improve the performance of equalization circuits at high data-rates.

Equalization circuitry is used to extract a data signal from a received signal. The received signal may be of poor quality because of frequency dependent attenuation causing inter-symbol interference (ISI), and because of other attenuation and noise that may be received with the signal. The received signal may also contain attenuation and noise introduced by the transmission and receiving circuitry and by the transmission media the signal was transmitted on. Accurately extracting the data signal from the received signal requires distinguishing the data signal from the ISI and noise signals received. Accurately extracting the transmitted data signal may be especially difficult in high-speed applications in which signal spread caused by ISI and timing errors in transmission or receiving circuitry may adversely affect the extraction of the data signal.

Feed-forward equalization (FFE) circuits and decision feedback equalization (DFE) circuits are commonly used to extract the data signal from the received signal. FFE circuits may be analog or digital circuits. DFE circuits generally include clocked digital circuits in their feedback loop. In order to improve the performance of equalization circuits, FFE and DFE circuits are generally used in combination.

In high-speed applications in which the data signal has a high data-rate, the FFE and DFE equalization circuits must be capable of operation at the high signal data-rate. However, the performance of known FFE and DFE circuits generally decreases at very high data-rates because of circuit parasitics, circuit loading, and noise.

It is an object of the present invention to provide improved equalization circuitry for use in high-speed, high data-rate applications.

SUMMARY OF THE INVENTION

Equalization methods and circuits for high data-rate applications are presented. The methods and circuits may be used to improve the performance of equalization circuits, including decision feedback equalization (DFE) circuits, operating at high frequencies and high data-rates.

Half-rate delay-chain circuitry produces delayed samples of the input signal. The delay-chain circuitry includes at least two delay-chains, each delay-chain including a series connection of delay elements. A first delay chain produces a first set of samples of the input signal in response to a first clock signal. A second delay chain produces a second set of samples of the input signal in response to a second clock signal having the same frequency as the first clock signal but being delayed with respect to the first clock signal. Multiplexer or other circuitry combines the samples produced by the delay chains to produce an output signal including samples of the input signal. In one embodiment, a half-rate delay-chain circuit includes two delay chains, each delay chain operating at a frequency equal to one-half the output signal data-rate, and the first and second clock signals being 180 degrees out of phase with each other. In other embodiments, the delay-chain circuit includes n delay chains, each delay chain operating at a frequency equal to 1/n the output signal data-rate, and each delay chain receiving a clock signal that is 360/n degrees out of phase with other clock signals. The delay-chain circuits of the invention may be operative at higher frequencies than known delay-chain circuits because each delay-chain of the circuit operates at a frequency lower than the signal data-rate. The delay-chain circuitry of the invention may be used in DFE circuits.

A duplicate path DFE circuit includes a first path operative to produce delayed samples of a DFE signal, and a second path operative to produce the DFE output signal. Each path includes a first circuit operative to produce a first signal, the first signals of the first circuits of the two paths being substantially equal. The first signal of the first path is used as an input to a DFE circuit, the DFE circuit producing a DFE signal equal to a first weighted sum of the first signal of the first path and delayed samples of the DFE signal. The first signal of the second path is used to produce the DFE output signal, the DFE output signal being equal to a second weighted sum of the first signal of the second path and delayed samples of the DFE signal. The coefficients of the second weighted sum may be equal to the coefficients of the first weighted sum. The duplicate path DFE circuit of the invention reduces the load of the DFE circuitry on the circuitry that precedes it in the data-path. The use of a duplicate path DFE circuit in equalization circuitry may allow the equalization circuitry to operate at high frequencies because of the reduced output load presented by the duplicate path DFE circuit. Duplicate path DFE circuits may advantageously be used with high data-rate signals.

Further features of the invention, its nature and various advantages, will be more apparent from the accompanying drawings and the following detailed description.

DETAILED DESCRIPTION

Figure 1:
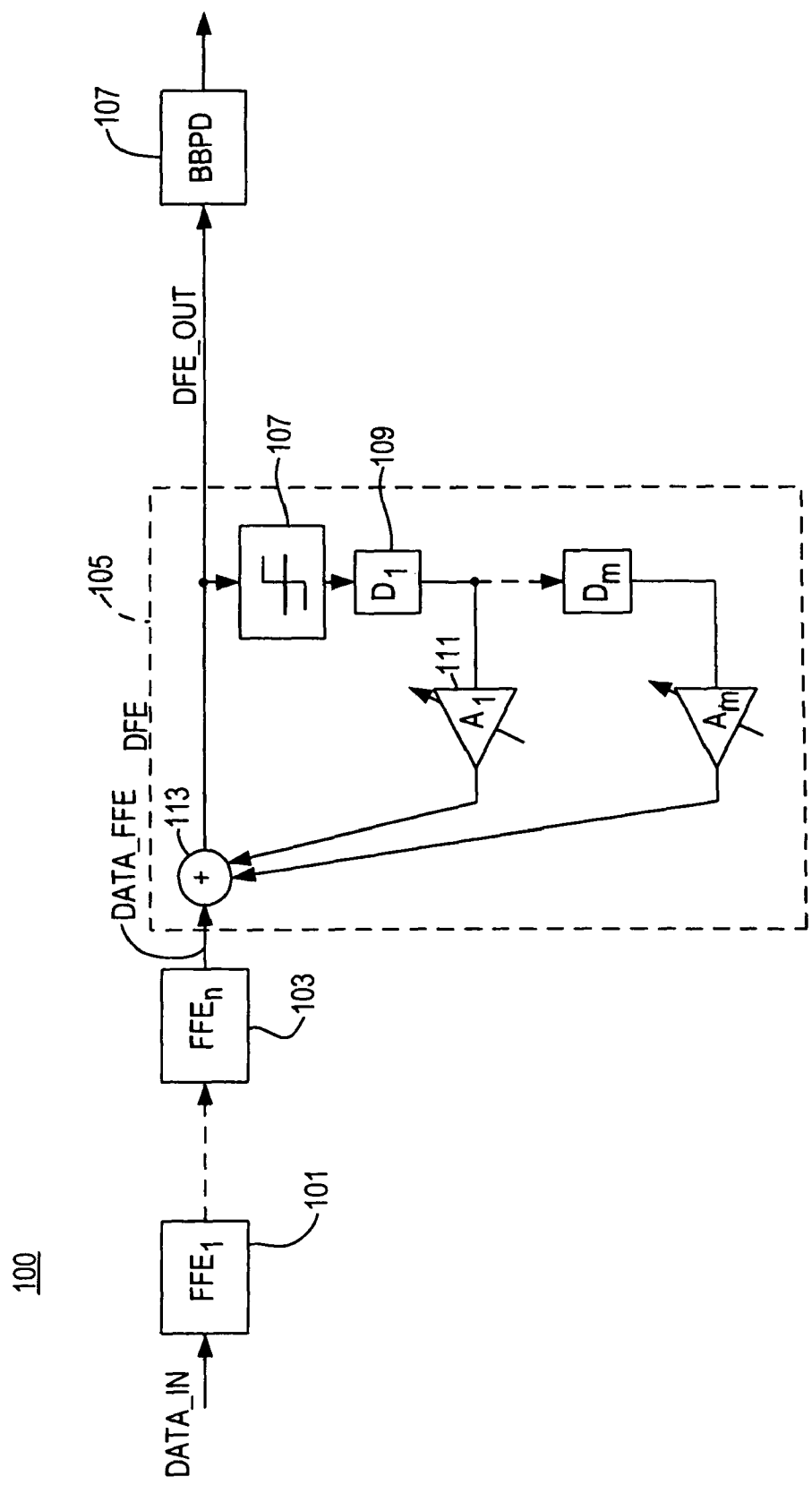
FIG. 1 shows a schematic diagram of an equalization circuit in accordance with the principles of the invention.

FIG. 1 shows a schematic diagram of an equalization circuit 100 including feed-forward equalization circuitry (FFE) 101 and 103, decision feedback equalization circuitry (DFE) 105, and bang-bang phase detection (BBPD) 107 or other clock data recovery circuitry (CDR). Input data signal DATA_IN may be processed through multiple FFE circuits $FFE_1$-$FFE_n$. The FFE circuits $FFE_1$-$FFE_n$ may be coupled in series. The final FFE circuit $FFE_n$ may produce an output signal DATA_FFE. The input data signal DATA_IN which serves as an input to the first FFE circuit $FFE_1$ may be received directly from an antenna or node coupled to the transmission medium. The input data signal may also be received from reception circuitry which may include buffer, filter and/or signal processing circuitry, for example.

DFE circuit 105 includes delay-chain circuitry including a quantizer 107 and m delay elements $D_1$-$D_m$ 109 coupled in series. The DFE circuit of FIG. 1 additionally includes tap circuitry 111 including m gain stages $A_1$-$A_m$. The output of each delay element $D_1$-$D_m$ is coupled to the input of a corresponding one of gain stages $A_1$-$A_m$. The output of each gain stage $A_1$-$A_m$ and the output of FFE circuit $FFE_n$ are coupled to summation block 113. The signal DFE_OUT at the output of summation block 113 is provided as an input to quantizer 107. The DFE_OUT signal also serves as a DFE output signal which is provided to the BBPD circuitry, CDR circuitry, or other circuitry coupled to the output of DFE equalization stage 105.

The DFE_OUT signal at the output of summation block 113 is equal to the weighted sum of the DFE input signal DATA_FFE and delayed samples of the DFE_OUT signal produced by the delay chain $D_1$-$D_m$. The coefficients of the weighted sum may be determined by the gain of the final FFE stage $FFE_n$ and by the gains $A_1$-$A_m$ of the gain stages. Summation block 113 may be a circuit. However, in current-mode implementations of DFE circuit 105 in which the final FFE stage $FFE_n$ and the gain stages $A_1$-$A_m$ produce current output signals, summation block 113 may be a common circuit node at which the output current signals of the circuits sum. Quantizer 107 produces a digital output signal indicative of the level of the DFE_OUT signal. Quantizer 107 may be a single-bit quantizer such as a comparator or high-gain amplifier. In some embodiments, quantizer 107 may not be used. In some embodiments, the first delay element $D_1$ of the delay chain may serve the dual purpose of quantizing the DFE_OUT signal and delaying the samples of the signal by one clock cycle. Each of the data signals on the data-paths shown in FIG. 1 may be single-ended signals or fully differential signals.

BBPD circuitry may include, or work in conjunction with, clock data recovery (CDR) circuitry. The CDR circuitry may be used to produce clock signals synchronized with the input data signal. The clock signals produced by the CDR circuitry may be used in the operation of the DFE circuitry of circuit 100. In the embodiment shown in FIG. 1, the BBPD or other CDR circuitry may be used to produce a clock signal coupled to delay elements $D_1$-$D_m$. In the embodiment shown in FIG. 2, for example, the clock data recovery circuitry may produce two output clock signals with frequencies one-half the input data rate for use in operating the DFE circuitry. The two clock signals may be 180 degrees out of phase. In the embodiment of FIG. 1, the CDR circuitry may produce four clock signals with phase intervals of 90 degrees, the four clock signals being used in the operation of the BBPD circuitry. Two of the clock signals may be synchronized with transitions in the input signal while the two other clock signals may lead or lag the synchronized signals by 90 degrees, for example.

Figure 2:
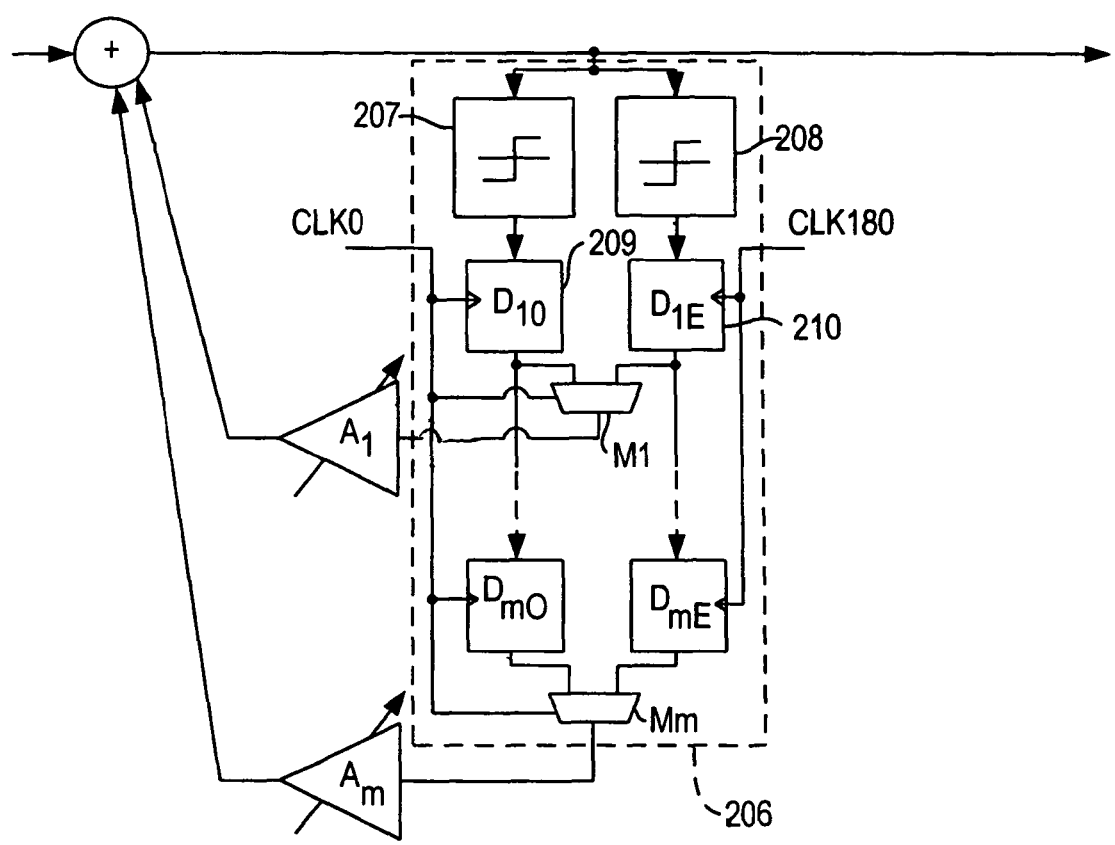
FIG. 2 shows a schematic diagram of a half-rate DFE circuit in accordance with the principles of the invention.

FIG. 2 shows a schematic diagram of a half-rate decision feedback equalization (DFE) circuit 200 in accordance with the principles of the invention. DFE circuit 200 includes two delay-chain circuits 206 operating in parallel. Each delay-chain circuit operates at half the input data rate and processes half of the input data samples. A first delay-chain circuit includes a first quantizer 207 and m delay elements $D_{1O}$-$D_{mO}$ operative to process odd samples of the DFE signal, while a second delay-chain circuit includes second quantizer 208 and m delay elements $D_{1E}$-$D_{mE}$ operative to process even samples of the DFE signal. Two clock signals CLK0 and CLK180 are used to synchronize the operation of the two delay-chain circuits. The delay elements $D_{1O}$-$D_{mO}$ of the first delay-chain may receive the CLK0 signal at their clock inputs. The delay elements $D_{1E}$-$D_{mE}$ of the second delay-chain may receive the CLK180 signal at their clock inputs. The clock signals may be 180 degrees out of phase, and may have a frequency of one-half the input signal data-rate. Multiplexers $M_1$-$M_m$ operating at the full data-rate are operative to recombine the delayed signals produced by the delay-chain circuits. Each multiplexer $M_n$ may receive at one input the output signal of a delay-chain element $D_{nO}$ of the first delay-chain and at another input the output signal of a corresponding delay-chain element $D_{nE}$ of the second delay-chain. The multiplexers $M_1$-$M_m$ may receive at their selection input one of the clock signals CLK0 and CLK180. Each multiplexer $M_n$ may produce at its output a recombined signal composed of alternate samples from the first and second delay chains. The recombined signal may include all samples of the input signal, in order and delayed by n clock cycles. The output of each multiplexer $M_n$ is fed to a corresponding gain stage $A_n$.

The use of two parallel delay-chain circuits as shown in FIG. 2 allows the quantization and delay-chain circuitry of the DFE circuit to operate at one-half the data rate. By operating at a slower speed, the quantizer and delay chain circuitry may exhibit improved performance. In particular, the resolution of the quantizer may increase. In addition, because the delay-chain circuitry requires clock signals with frequencies that are one-half of the data rate, the voltage controlled oscillator (VCO) or other clock generation circuitry used to produce the clock signals may operate more slowly. The clock generation circuitry may also produce less noise by operating at a lower frequency.

Multiplexers $M_1$-$M_m$ operating at the full-data rate are operative to recombine the delayed signal samples produced by each of the delay chains. Multiplexers $M_1$-$M_m$ may receive at their selection input a clock signal switching at half the data rate, such as the CLK0 signal. Multiplexers $M_1$-$M_m$ will switch between their inputs after each transition in the clock signal. The multiplexers therefore effectively operate at the full data rate and switch between their inputs twice per clock period. Each multiplexer output signal may be equal to an odd data-sample (sample number 1, 3, 5, etc.) during the first half of a clock period, and be equal to an even data-sample (sample number 2, 4, 6, etc.) of the data signal during the second half of the clock period. Each multiplexer produces a delayed version of the input data signal including all samples of the data signal (sample numbers 1, 2, 3, etc.).

Quantization circuits 207 and 208 may include comparator circuits or high-gain amplification circuits, for example. While two quantization circuits 207 and 208 are shown in circuit 200, a single quantization circuit with an output coupled to the first delay elements $D_{1O}$ and $D_{1E}$ of the two delay chains may also be used. Alternatively, no quantization may be required, for example in circuits in which the first delay elements $D_{1O}$ and $D_{1E}$ quantize their input signals themselves. Delay elements $D_n$, may be flip-flops, latches, or other circuits. Illustrative latch circuitry that may be used as delay elements is described in relation to FIG. 5.

While the circuitry of FIG. 2 shows a half-rate DFE circuit including two parallel delay-chain circuits, additional parallel delay-chain circuits may be used to further reduce the frequency of operation of the quantization and delay-chain circuitry. For example, a one-third-rate DFE circuit could include three parallel delay-chain circuits, the registers in each delay-chain being controlled by clock signals CLK0, CLK120 and CLK240 with relative phases of 0 degrees, 120 degrees, and 240 degrees. The clock signals may have frequencies of one-third the data-rate. Three-input multiplexers may be used to recombine the delayed samples from each of the delay-chain circuits into a full data-rate signal. Additional multiplexer control circuitry may be required in order to recombine the three delay-chain signals.

Figure 3:
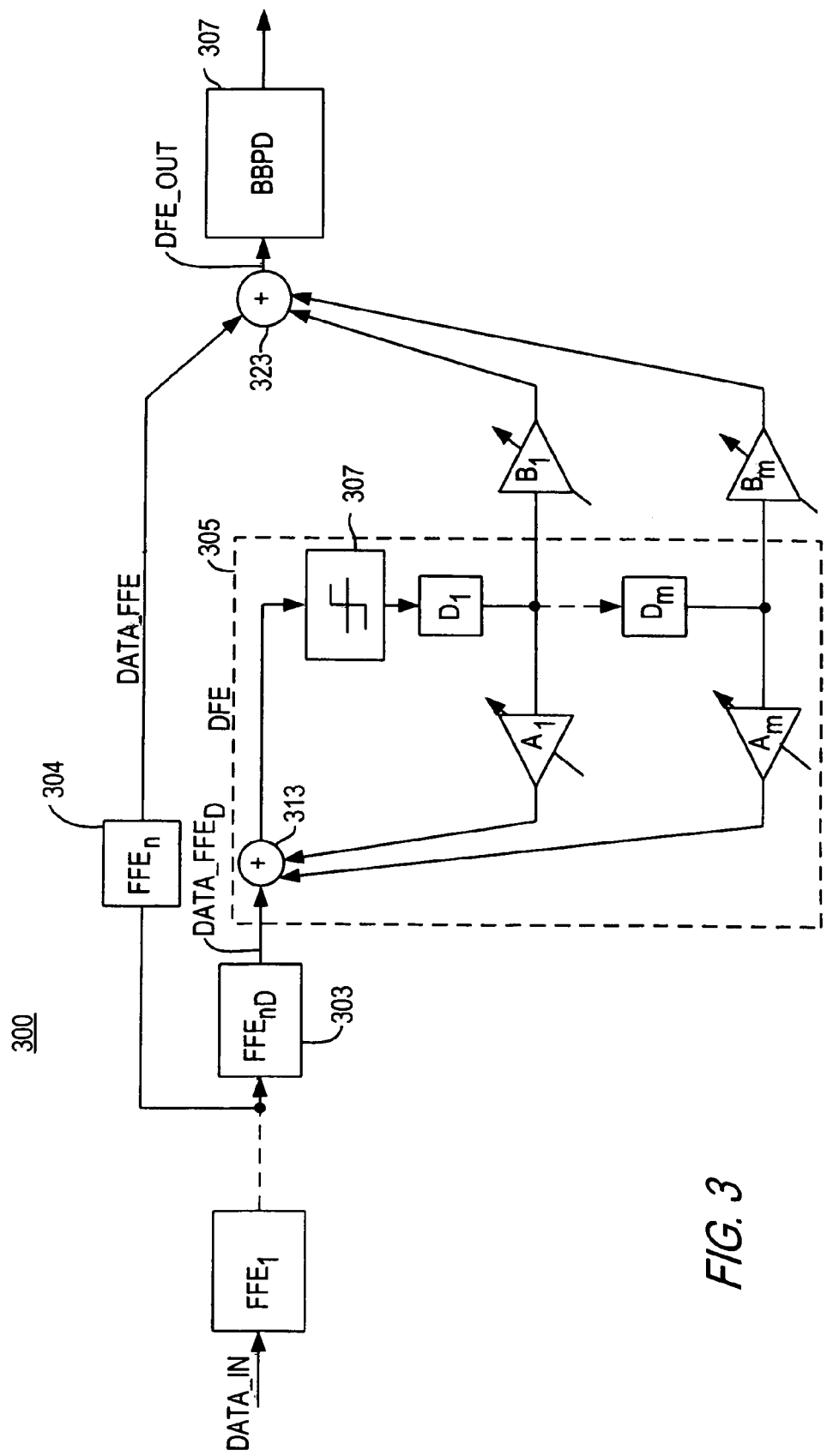
FIG. 3 shows a schematic diagram of a duplicate path equalization circuit in accordance with the principles of the invention.

FIG. 3 shows a schematic diagram of a duplicate path decision feedback equalization (DFE) circuit 300 in accordance with the invention. DFE circuit 300 includes duplicate paths used to produce the DFE output signal DFE_OUT. Duplicate paths are used to reduce the loading of the DFE circuitry on the output of the circuitry that precedes it, such as final FFE stage $FFE_n$. Each data-path includes a final FFE stage $FFE_n$ or $FFE_{nD}$ and a summation block 313 or 323. Alternatively, instead of including a final FFE stage, each data-path could include a buffer receiving at its input the signal at the output of the final FFE stage. Summation blocks 313 and 323 produce DFE signals equal to the weighted sum of delayed samples of the DFE signals and of the DFE input signals produced, respectively, by each data-path's final FFE stage. The dual FFE circuits $FFE_n$ and $FFE_{nD}$ may be substantially identical circuits that provide substantially identical copies of the data signal DATA_FFE to summation blocks 323 and 313, respectively. Summation block 323 produces the DFE output signal DFE_OUT and is coupled to circuitry in the main data-path. Summation block 323 may provide the DFE_OUT signal to BBPD circuitry or CDR circuitry in the data-path. Summation block 313 produces a DFE signal used as an input to the delay-chain circuitry of DFE circuit 305. The output of each summation block 323 and 313 is thereby loaded with substantially equal loads each equal to approximately one-half of the load seen by summation block 113 of FIG. 1. Similarly, each FFE circuit $FFE_n$ and $FFE_{nD}$ is loaded with substantially equal loads. Because of the reduced load on summation blocks 323 and 313 and on FFE circuits $FFE_n$ and $FFE_{nD}$, the summation blocks and FFE circuits may be capable of operation at higher frequencies than summation block 113 and FFE circuit $FFE_n$ of FIG. 1. Duplicate path DFE circuit 300 may therefore be capable of operation at higher frequencies than DFE circuit 100.

DFE circuit 300 includes a first dummy FFE circuit $FFE_{nD}$ operative to produce an output signal $DATA\_FFE_D$ for use by DFE circuitry 305 in a manner similar to FFE circuit $FFE_n$ of FIG. 1. However, unlike the output of FFE circuit $FFE_n$ of FIG. 1, the output of dummy FFE circuit $FFE_{nD}$ does not form part of the DFE output signal DFE_OUT. The output load on dummy FFE circuit $FFE_{nD}$ may be significantly reduced because the $FFE_{nD}$ circuit and summation block 313 only drive DFE circuit 305. The $FFE_{nD}$ circuitry may therefore be able to operate at higher frequencies than $FFE_n$ circuit 103 of FIG. 1. The quantization, delay-chain $D_1$-$D_m$ and gain stage $A_1$-$A_m$ circuits of DFE circuit 305 may be used in the same way as the circuitry of FIG. 1.

DFE circuit 300 includes a second $FFE_n$ circuit operative to produce an output signal DATA_FFE for use by further signal processing circuitry such as BBPD circuitry. The output DATA_FFE of second $FFE_n$ circuit is provided as an input to summation block 323. Summation block 323 also receives input from gain stages $B_1$-$B_m$. Gain stages $B_1$-$B_m$ may be operative to produce output signals substantially equal to the outputs of gain stages $A_1$-$A_m$. Gain stages $B_1$-$B_m$ receive at their input the same input signals as corresponding stages $A_1$-$A_m$, the input signals being equal to quantized and delayed versions of the DFE signal produced at the output of summation block 313. By setting the gains of stages $B_1$-$B_m$ equal to gains of corresponding stages $A_1$-$A_m$, the signals at the outputs of stages $B_1$-$B_m$ may be equal to the signals at the outputs of stages $A_1$-$A_m$. Summation block 323 may therefore produce output signal DFE_OUT substantially equal to the output of summation block 313, or to the output of summation block 113 of FIG. 1. The DFE_OUT signal may be provided to further processing circuitry such as BBPD or CDR circuitry.

In some embodiments, dual buffer or other circuits may be used instead of the dual FFE circuits $FFE_n$ and $FFE_{nD}$ shown in FIG. 3. Dual buffer or other circuits may receive the same input signal and may be used to produce substantially equal output signals in a manner similar to FFE circuits $FFE_n$ and $FFE_{nD}$. The substantially equal output signals of the dual buffer circuits may be used as inputs to summation blocks 313 and 323.

The performance of duplicate path DFE circuit 300 may be enhanced by ensuring that the loadings of the duplicate paths are precisely matched. In order to match the loadings of the duplicate paths, the $FFE_n$ and $FFE_{nD}$ circuits may be identical or substantially identical. In addition, the loading seen by the $FFE_n$ circuit at the input of summation block 323 may be matched to the loading seen by the $FFE_{nD}$ circuit at the input of summation block 313. Matching the loadings may also involve ensuring that the loadings seen by gain stages $B_1$-$B_m$ at the input of summation block 323 be matched to the loadings seen by gain stages $A_1$-$A_m$ at the input of summation block 313. This may require the input impedance of BBPD circuit 307 or other circuitry coupled to the output of summation block 323 to be matched to the input impedance of the delay chain coupled to the output of summation block 313 in DFE circuit 305. Additional buffer circuits and dummy circuits (not shown in FIG. 3) may be placed at various locations in circuit 300 to ensure that loadings are precisely matched.

Figure 4:
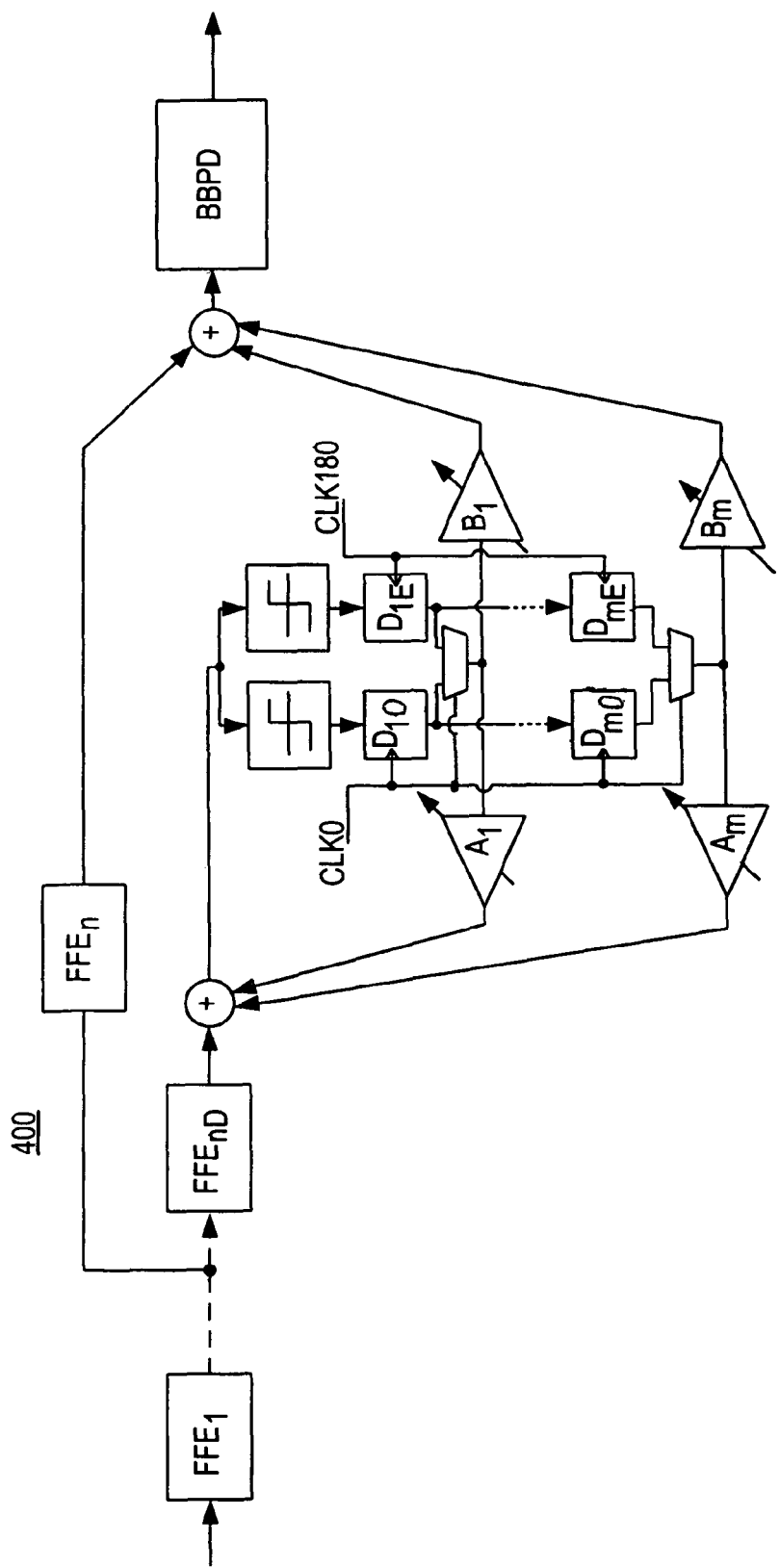
FIG. 4 shows a schematic diagram of a duplicate path equalization circuit including half-rate DFE circuitry in accordance with the principles of the invention.

FIG. 4 shows a schematic diagram of a duplicate path equalization circuit (DFE) 400 including half-rate decision feedback in accordance with the invention. Duplicate path DFE circuit 400 includes two delay-chain circuits operating in parallel at one-half the input data rate. The delay-chain circuitry of circuit 400 operates substantially identically to delay-chain circuitry 206 of FIG. 2. DFE circuitry 400 includes duplicate path circuitry used to reduce loading on the DFE circuitry and allow circuit 400 to operate at higher speeds. The duplicate path circuitry of circuit 400 operates substantially identically to duplicate path circuitry 300 of FIG. 3. By incorporating duplicate paths and dual delay-chain circuits, DFE circuit 400 may be operative at very high data rates.

Figure 5:
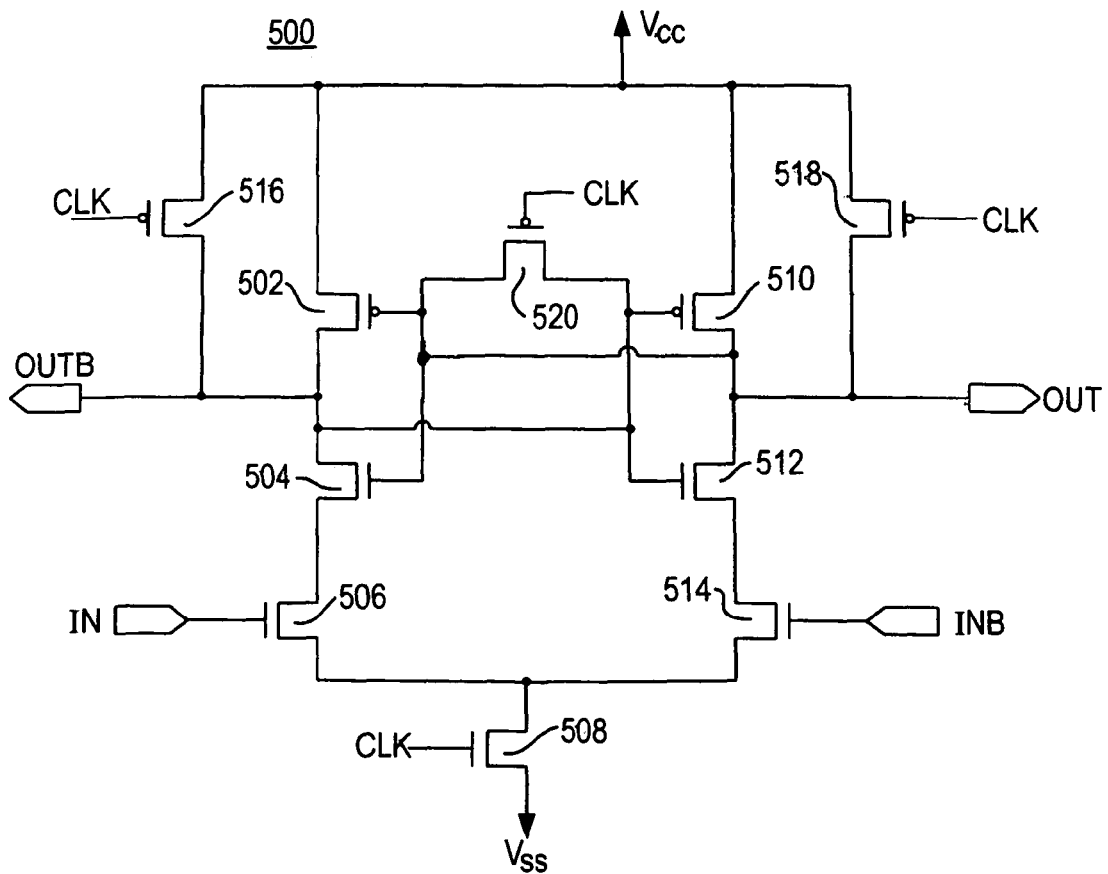
FIG. 5 shows a circuit diagram of a latch circuit in accordance with the principles of the invention.
Figure 5:
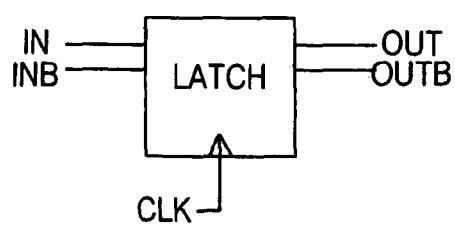
Figure 6:
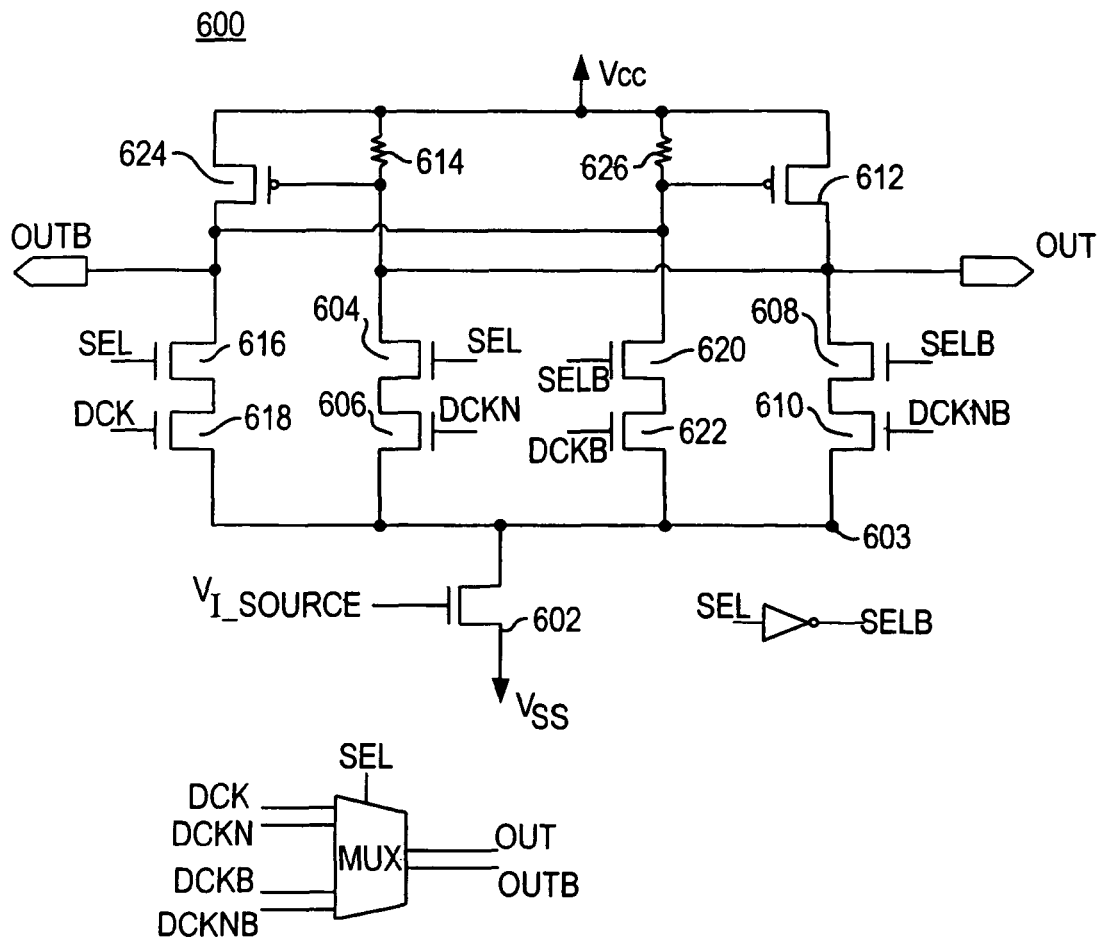
FIG. 6 shows a circuit diagram of a multiplexer circuit in accordance with the principles of the invention.
Figure 7:
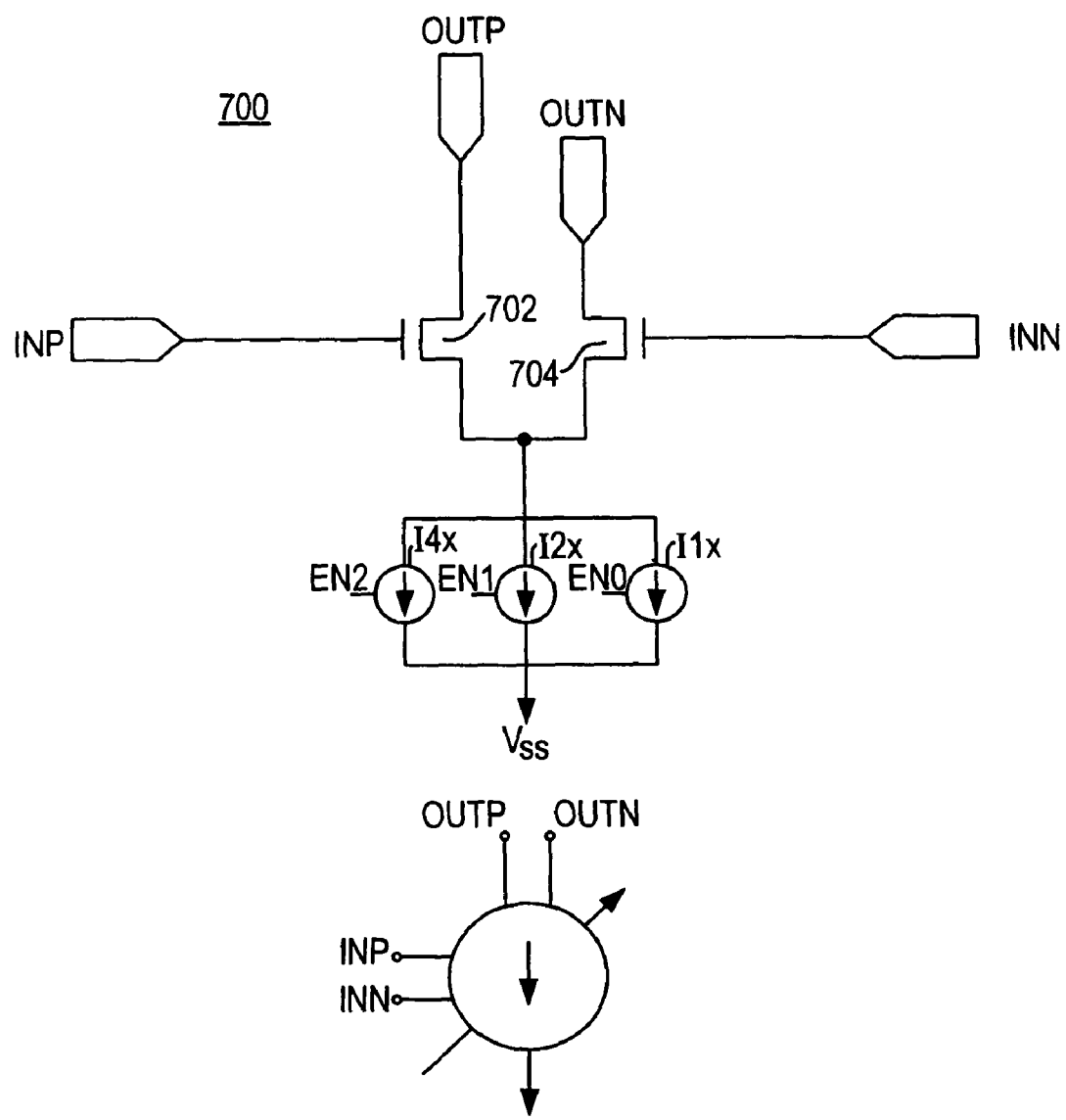
FIG. 7 shows a circuit diagram of a variable and programmable current source circuit in accordance with the principles of the invention.

FIGS. 5-7 show circuit diagrams of circuitry that may be used in implementations of equalization circuits such as equalization circuit 100, 200, 300 and 400 of FIGS. 1-4. FIG. 5 shows a circuit diagram of a fully differential latch circuit operative to store the states of differential inputs IN and INB at outputs OUT and OUTB. Latch 500 may be triggered by rising-edge transitions in the clock signal CLK. Latch circuit 500 may be used as a delay element $D_n$, in any of the delay-chain circuits shown in DFE circuits 100, 200, 300 and 400. Latch circuit 500 may also be used in many other applications including applications in which latch and flip-flop circuits are used.

Latch circuit 500 includes a first series connection of PMOS transistor 502 and NMOS transistors 504, 506 and 508 between the upper power supply $V_{CC}$ and the lower power supply $V_{SS}$. Circuit 500 includes a second series connection of PMOS transistor 510 and NMOS transistors 512 and 514 between the upper power supply $V_{CC}$ and the common node of transistors 506 and 508. The gates of transistors 506 and 514 are coupled to the differential input signal IN/INB. The output node OUT is coupled to the drain of transistors 510 and 512, as well as to the gates of transistors 502 and 504. The complementary output node OUTB is coupled to the drain of transistors 502 and 504, as well as to the gates of transistors 510 and 512. PMOS transistors 516 and 518 are coupled between the upper power supply and one of the OUTB and OUT nodes, respectively. PMOS transistor 520 is coupled between the OUTB and OUT nodes. Transistors 508, 516, 518, and 520 have gates coupled to the clock CLK input.

Latch circuit 500 maintains both output nodes OUT and OUTB high when the clock input CLK is low. As soon as the clock input goes high, the OUT and OUTB nodes assume logic levels corresponding to the IN and INB signals, respectively. The OUT and OUTB nodes maintain these logic levels until the CLK input goes low.

FIG. 6 shows a circuit diagram of a fully differential multiplexer 600. Multiplexer 600 is operative to pass one of its differential inputs DCK/DCKN and DCKB/DCKNB to its differential outputs OUT and OUTB depending on the state of the input selection signal SEL. Multiplexer 600 may be used as a multiplexer in any of the half-rate delay chain circuits shown in DFE circuits 200 and 400, for example.

Multiplexer 600 includes a current mirror transistor 602 coupled between a source of lower voltage $V_{SS}$ or ground node and an intermediate node 603. Transistor 602 receives at its gate a $V_{I\_SOURCE}$ voltage which sets the amplitude of the current sunk by the current mirror 602. A first set of transistors 604 and 606 and a second set of transistors 608 and 610 are each coupled in series between the intermediate node 603 and the non-inverting output node OUT. Transistor 604 and 608 receive at their gate nodes signals SEL and SELB where the SELB signal is the complement of the SEL signal. Transistors 606 and 610 receive at their gate nodes the differential pair of signals DCKN and DCKNB. Transistor 612 and resistor 614 are coupled in parallel between output node OUT and the upper power supply $V_{cc}$. The gate of transistor 612 is coupled to the complementary output node OUTS. A third set of transistors 616 and 618 and a fourth set of transistors 620 and 622 are each coupled in series between the intermediate node 603 and the inverting output node OUTS. Transistor 616 and 620 receive at their gate nodes signals SEL and SELB. Transistors 618 and 622 receive at their gate nodes the differential pair of signals DCK and DCKB. Transistor 624 and resistor 626 are coupled in parallel between output node OUTS and the upper power supply $V_{cc}$. The gate of transistor 624 is coupled to the output node OUT.

Multiplexer 600 is operative to pass the differential pair of signals DCK/DCKN to its differential output OUT/OUTS when the SEL input is high (corresponding to a low SELB input). Multiplexer 600 is operative to pass the differential pair of signals DCKB/DCKNB to its differential output OUT/OUTB when the SEL input is low (corresponding to a high SELB input).

FIG. 7 shows a circuit diagram of a variable and programmable current source 700. Current source 700 is operative to produce output current signals at output leads OUTP and OUTN in response to signals at inputs INP/INN. Selection bits EN0-EN2 are operative to programmably adjust the range of currents that current source 700 may produce.

Current source 700 may be used as a gain stage in current-mode implementations of DFE circuits such as circuits 100, 200, 300, and 400. In current-mode implementations of DFE circuits, summation blocks such as summation blocks 113, 313 and 323 may receive current signals at their inputs and may produce output current signals. In circuit embodiments, the summation blocks may be circuit nodes at which current signals produced by one or more inputs to the summation block sum to produce the current output signal. Current source 700 may also be used in other applications. Other circuitry may be used as gain stages in DFE circuits such as circuits 100, 200, 300 and 400. In voltage-mode implementations of the DFE circuits, for example, variable voltage sources may be used to produce the output signals of the gain stages.

Current source 700 may include a differential pair of NMOS transistors 702 and 704 receiving at their gates the differential input signal INP/INN. The drain terminals of transistors 702 and 704 may be coupled to the output leads OUTP and OUTN, respectively. The common source node of transistors 702 and 704 may be coupled to a current source. In the embodiment shown in FIG. 7, the voltage source is a programmably variable current source including three selectable current sources I4x, I2x and I1x coupled in parallel between the common source node and the lower power supply $V_{SS}$.

Each current source I4x, I2x and I1x may be separately activated by enable inputs EN2, EN1 and EN0, respectively. Each current source may be configured to sink a different amount of current. In one embodiment, the I2x may sink twice as much current as the I1x source and the I4x may sink twice as much current as the I2x source. The combination of the I4x, I2x and I1x current sources may therefore be operative to sink variable amounts of current in the range from one to seven times the current sunk by the I1x source in unit increments of the I1x current.

Figure 8:
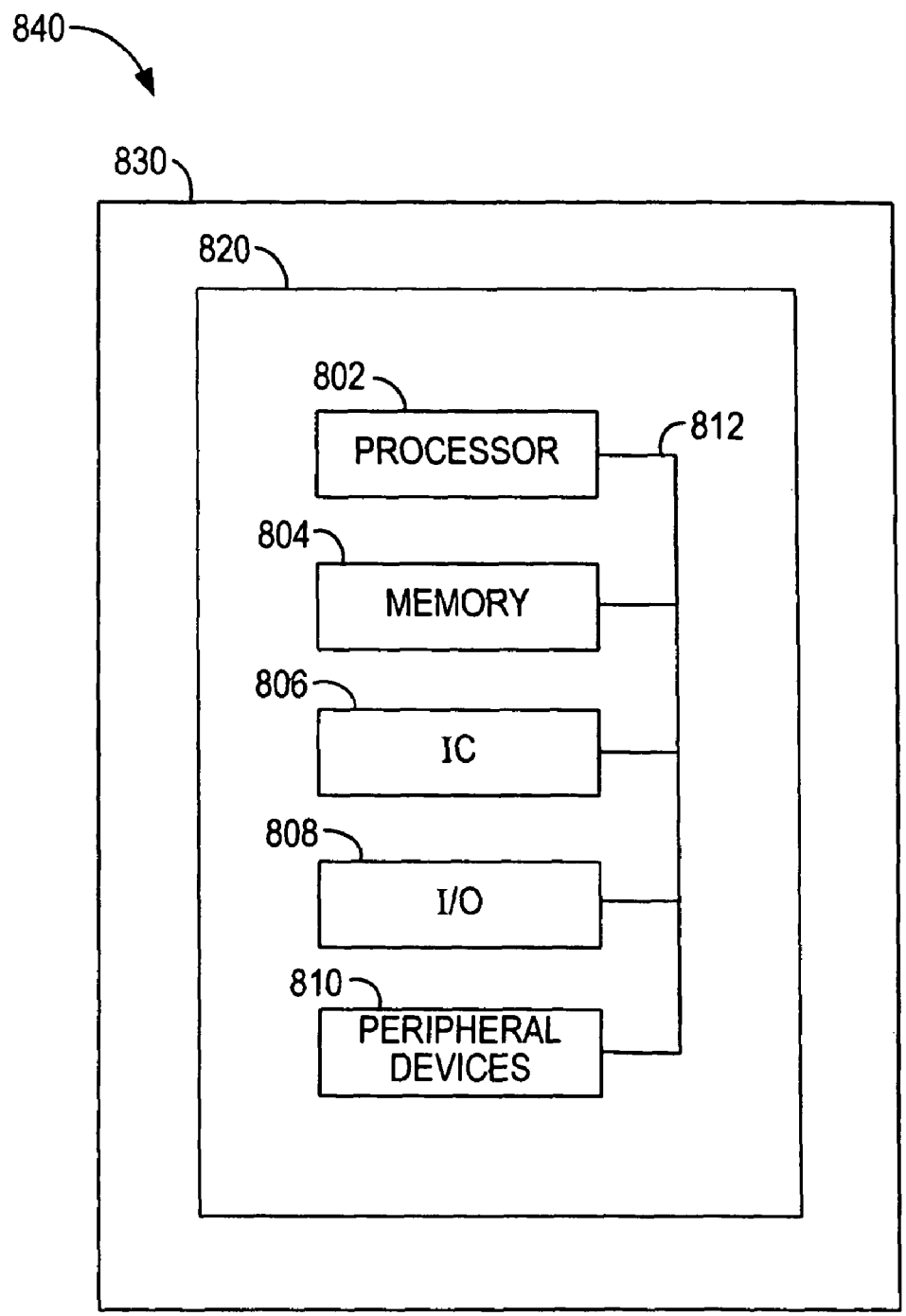
FIG. 8 shows a schematic diagram of an integrated circuit system that may be used in conjunction with equalization methods and circuits of the invention.

FIG. 8 illustrates an IC 806 which incorporates equalization methods and apparatus in accordance with this invention in a data processing system 840. IC 806 may be a PLD, an application-specific IC ("ASIC"), or a device possessing characteristics of both a PLD and an ASIC. Data processing system 840 may include one or more of the following components: processor 802; memory 804; I/O circuitry 808; and peripheral devices 810. These components are coupled together by a system bus 812 and are populated on a circuit board 820 which is contained in an end-user system 830. Equalization methods and circuits in accordance with the principles of the invention may be implemented in transceiver circuitry included in I/O circuitry 808, in data processing circuitry, or in other circuitry of system 840.

System 840 can be used in a wide variety of applications, such as receiver and transceiver applications, computer networking, data networking, instrumentation, video processing, or digital signal processing. IC 806 can be used to perform a variety of different logic functions. For example, IC 806 can be configured as a processor or controller that works in cooperation with processor 802. IC 806 may also be used as an arbiter for arbitrating access to a shared resource in system 840. In yet another example, IC 806 can be configured as an interface between processor 802 and one of the other components in system 840.

Methods and circuits are provided for providing high quality equalization for high data-rate applications. One skilled in the art will appreciate that the invention can be practiced by other than the described embodiments, which are presented for purposes of illustration and not of limitation. The invention is limited only by the claims which follow.

What is claimed is:

1. A method for producing an output signal based on an input signal, the output signal having a data-rate, the method comprising:

producing a first set of delayed samples of the output signal by using first circuitry to (a) sample the output signal at a first rate equal to a first integer fraction of the data-rate and (b) delay the samples by a first delay;

producing a second set of delayed samples of the output signal by using second circuitry to (a) sample the output signal at the first rate after a delay equal to a second integer fraction of the data-rate period, wherein the first integer fraction is equal to the second integer fraction, and (b) delay the samples by the first delay;

using multiplexer circuitry to alternately select samples from the first and second sets to produce successive selected samples, wherein the selected samples comprise a sample of the first set every integer number of data-rate periods and a sample of the second set following each sample of the first set;

passing the selected samples output by the multiplexer circuitry through gain circuitry; and using summation circuitry to combine the selected samples, after passage through the gain circuitry, with the input signal in production of the output signal.

2. The method of claim 1 wherein the first integer fraction is equal to one-half.

3. The method of claim 1, further comprising:
producing a third set of delayed samples of the output signal by delaying the samples of the first set by a second delay;
producing a fourth set of delayed samples of the output signal by delaying the samples of the second set by the second delay; and
using the summation circuitry to additionally combine signals based on the third and fourth sets with the input signal and the samples that have been passed through the gain circuitry in production of the output signal.

4. A delay-chain circuit receiving an input signal and producing an output signal with a data-rate, the output signal comprising the input signal combined with delayed and weighted samples of the output signal, the circuit comprising:
first delay-chain circuitry comprising a clocked delay circuit receiving at its input the output signal, the clocked delay circuit of the first delay-chain receiving a first clock signal wherein the first clock signal has a first frequency that is a first integer fraction of the data-rate;
second delay-chain circuitry comprising a clocked delay circuit receiving at its input the output signal, the clocked delay circuit of the second delay-chain receiving a second clock signal wherein the second clock signal has a frequency equal to the first frequency and is delayed with respect to the first clock signal by an integer fraction of the clock period equal to the first integer fraction;
multiplexer circuitry receiving at an input an output of the clocked delay circuit of the first delay-chain circuitry and at another input an output of the clocked delay circuit of the second delay-chain circuitry, the multiplexer producing a multiplexer output signal by alternately transmitting one of its inputs to its output during each period of the data-rate;
gain circuitry that receives the multiplexer output signal and applies a gain coefficient to the multiplexer output signal to produce a weighted multiplexer output signal; and
circuitry for combining the input signal with the weighted multiplexer output signal in production of the output signal.

5. The circuit of claim 4 wherein the first integer fraction is equal to one-half.

6. The circuit of claim 5 wherein the multiplexer circuitry receives at its selection input one of the first and the second clock signals.

7. The circuit of claim 4 wherein the multiplexer output signal is equal to the output of the clocked delay circuit of the second delay-chain during each period of the data-rate immediately following a period of the data-rate during which the multiplexer output signal is equal to the output of the clocked delay circuit of the first delay-chain.

8. A decision feedback equalization circuit comprising the delay-chain circuitry of claim 4.

9. A delay-chain circuit receiving an input signal and producing an output signal with a data-rate, the output signal comprising the input signal combined with delayed and weighted samples of the output signal, the circuit comprising:
first delay-chain circuitry comprising at least two clocked delay circuits coupled in series, a first clocked delay circuit of the first delay-chain receiving at its input the output signal, the at least two clocked delay circuits of the first delay-chain receiving a first clock signal wherein the first clock signal has a first frequency that is a first integer fraction of the data-rate;
second delay-chain circuitry comprising at least two clocked delay circuits coupled in series, a first clocked delay circuit of the second delay-chain receiving at its input the output signal, the at least two clocked delay circuits of the second delay-chain receiving a second clock signal wherein the second clock signal has a frequency equal to the first frequency and is delayed with respect to the first clock signal by an integer fraction of the clock period equal to the first integer fraction;
multiplexer circuitry receiving at an input an output of the first clocked delay circuit of the first delay-chain circuitry and at another input an output of the first clocked delay circuit of the second delay-chain circuitry, the multiplexer producing a multiplexer output signal by alternately transmitting one of its inputs to its output during each period of the data-rate;
gain circuitry that receives the multiplexer output signal and applies a gain coefficient to the multiplexer output signal to produce a weighted multiplexer output signal; and
circuitry for combining the input signal with the weighted multiplexer output signal in production of the output signal.

10. The circuit of claim 9 wherein the first integer fraction is equal to one-half.

11. The circuit of claim 10 wherein the multiplexer output signal is equal to samples of the output of the first delay chain every other period of the data-rate, and the multiplexer output signal is equal to samples of the output of the second delay chain during the remaining periods.

12. The circuit of claim 9, further comprising:
second multiplexer circuitry receiving at an input an output of a second clocked delay circuit of the first delay-chain circuitry and at another input an output of a second clocked delay circuit of the second delay-chain circuitry, the second multiplexer producing a second multiplexer output signal by alternately transmitting one of its inputs to its output during each period of the data-rate; and
second gain circuitry that receives the second multiplexer output signal and applies a second gain coefficient to the second multiplexer output signal to produce a second weighted multiplexer output signal, wherein the circuitry for combining additionally combines the second weighted multiplexer output signal with the input signal and the weighted multiplexer output signal.

13. A method for producing an output signal that is based on an input signal using decision feedback equalization (DFE) methods, the method comprising:
using first circuitry to produce first and second signals from the input, the first and second signals being distinct signals;

using DFE circuitry to produce a DFE signal using the first signal as an input, the DFE signal being equal to a first weighted sum of the first signal and of delayed samples of the DFE signal; and using summation block circuitry to produce the output signal equal to a second weighted sum of the second signal and of the delayed samples of the DFE signal, wherein the second weighted sum has coefficients equal to corresponding coefficients of the first weighted sum.

14. The method of claim 13 wherein the first and second signals are substantially equal.

15. The method of claim 14 wherein the DFE signal is substantially equal to the output signal.

16. A duplicate path decision feedback equalization circuit receiving an input signal and producing an output signal, the circuit comprising:
  first circuitry producing a first signal from the input signal;
  second circuitry producing a second signal from the input signal;
  decision feedback circuitry receiving at an input the first signal, the decision feedback circuitry producing an intermediate signal wherein the intermediate signal is equal to a first weighted sum of the first signal and of delayed samples of the intermediate signal; and
  circuitry producing the output signal, wherein the output signal is equal to a second weighted sum of the second signal and of the delayed samples of the intermediate signal, wherein the second weighted sum has coefficients that are substantially equal to corresponding coefficients of the first weighted sum.

17. The circuit of claim 16 wherein the first and second circuitries are buffer circuits.

18. A duplicate path decision feedback equalization circuit receiving an input signal and producing an output signal, the circuit comprising:
  first circuitry for producing a first signal from the input signal;
  second circuitry producing a second signal from the input signal;
  decision feedback circuitry receiving at an input the first signal, the decision feedback circuitry producing an intermediate signal wherein the intermediate signal is equal to a first weighted sum of the first signal and of delayed samples of the intermediate signal; and
  circuitry producing the output signal, wherein the output signal is equal to a second weighted sum of the second signal and of the delayed samples of the intermediate signal, and wherein the first and second circuitries are substantially identical feed-forward equalization circuits.

19. A duplicate path decision feedback equalization (DFE) circuit receiving an input signal and producing an output signal, the circuit comprising:
  first circuitry for producing a first signal from the input signal;
  second circuitry for producing a second signal from the input signal;
  decision feedback circuitry receiving at an input the first signal and producing a DFE signal, the decision feedback circuitry comprising:
    first delay-chain circuitry for producing a first subset of delayed samples of the DFE signal;
    second delay-chain circuitry for producing a second subset of delayed samples of the DFE signal, wherein the first and second delay-chain circuitries sample the DFE signal at times that alternate with one another to produce their respective first and second subsets of delayed samples; and
    circuitry for producing the DFE signal by combining the first signal with the first and second subsets of delayed samples of the DFE signal during respective alternating time periods; and
  circuitry for producing the output signal by combining the second signal with the first and second subsets of delayed samples of the DFE signal during respective alternating time periods.

20. The circuit of claim 19 wherein the circuitry for producing the DFE signal comprises circuitry for producing the DFE signal from a first weighted sum of the first signal and first and second subsets of delayed samples of the DFE signal.

21. The circuit of claim 20 wherein the circuitry for producing the output signal comprises circuitry for producing the output signal from a second weighted sum of the second signal and first and second subsets of delayed samples of the DFE signal, wherein the coefficients of the first and second weighted sums are equal.

* * * * *